United States Patent
Kawamura et al.

(10) Patent No.: US 7,550,678 B2
(45) Date of Patent: Jun. 23, 2009

(54) PLASMA DISPLAY MODULE

(75) Inventors: Tomoyuki Kawamura, Kawasaki (JP); Taizo Ohno, Inagi (JP); Yoshinori Okada, Yokohama (JP); Takashi Sasaki, Hiratsuka (JP); Hideki Isohata, Yokohama (JP); Kenji Ishiwata, Sagamihara (JP)

(73) Assignee: Fujitsu Hitachi Plasma Display Limited, Miyazaki-ken (JP)

( * ) Notice: Subject to any disclaimer, the term of this patent is extended or adjusted under 35 U.S.C. 154(b) by 441 days.

(21) Appl. No.: 11/407,904

(22) Filed: Apr. 21, 2006

(65) Prior Publication Data

US 2006/0238691 A1    Oct. 26, 2006

(30) Foreign Application Priority Data

Apr. 21, 2005    (JP)    ............................. 2005-123165

(51) Int. Cl.
 *H05K 1/00*    (2006.01)
(52) U.S. Cl. ....................... 174/250; 361/681
(58) Field of Classification Search ............ 174/250; 361/681
See application file for complete search history.

(56) References Cited

U.S. PATENT DOCUMENTS

| | | | |
|---|---|---|---|
| 6,331,883 B1 * | 12/2001 | Hasegawa et al. ........... | 349/152 |
| 6,490,165 B2 | 12/2002 | Mizusaki | |
| 2001/0033009 A1 * | 10/2001 | Inoue et al. .................. | 257/668 |
| 2004/0101993 A1 * | 5/2004 | Salmon ....................... | 438/107 |
| 2005/0111175 A1 * | 5/2005 | Kim ............................ | 361/681 |
| 2005/0194900 A1 * | 9/2005 | Kim et al. .................... | 313/582 |

FOREIGN PATENT DOCUMENTS

| | | |
|---|---|---|
| CN | 1128782 | 8/1996 |
| CN | 1359258 | 7/2002 |
| JP | 2003-216054 | 7/2003 |
| JP | 2003-324255 | 11/2003 |
| JP | 2005-038636 | 2/2005 |

* cited by examiner

*Primary Examiner*—Jeremy C Norris
*Assistant Examiner*—Andargie M Aychillhum
(74) *Attorney, Agent, or Firm*—Antonelli, Terry, Stout & Kraus, LLP.

(57) ABSTRACT

In a plasma display module, a flexible substrate is strengthened and a mounting structure for alleviating stresses is provided, thereby preventing the metal fatigue of wirings. In a PDP (Plasma Display Panel) module, a metal plate and a flexible substrate constituting a driver module are provided. On the flexible substrate, wirings not connected to electrodes of the panel (independent linear patterns) are disposed on an outer side of wirings and near an edge portion of the metal plate to which the flexible substrate is attached.

21 Claims, 9 Drawing Sheets

PLASMA DISPLAY MODULE

CROSS-REFERENCE TO RELATED APPLICATION

The present application claims priority from Japanese Patent Application No. JP 2005-123165 filed on Apr. 21, 2005, the content of which is hereby incorporated by reference into this application.

TECHNICAL FIELD OF THE INVENTION

The present invention relates to a plasma display module (PDP module). More particularly, it relates to a flexible substrate of the PDP module and a mounting structure of the flexible substrate.

BACKGROUND OF THE INVENTION

In general, in a plasma display panel (PDP), discharge gas is filled in spaces between opposing glass substrates. In this structure, discharges are generated by electrodes disposed in a matrix form, and phosphors of the cells separated by barrier ribs are excited by the discharges to emit light. A drive circuit which applies voltages to each electrode is disposed on a rear side of the PDP, and the PDP is electrically connected to the drive circuit via a flexible substrate. An example of this structure is disclosed in the technology of Japanese Patent Application Laid-Open Publication No. 2003-216054 (Patent Document 1).

The flexible substrate is usually disposed on a metal plate, and an edge portion of the metal plate is coated with resin such as silicon for the purpose of improving moisture resistance. An example of this structure is disclosed in the technology of Japanese Patent Application Laid-Open Publication No. 2005-38636 (Patent Document 2).

FIG. 9 to FIG. 11 are explanatory drawings showing a structure example of a conventional PDP module for comparison with an embodiment of the present invention. FIG. 9 is a detail drawing showing a structure example of a conventional driver module (40). The conventional driver module (40) includes a metal plate 21 serving as a heat radiating member, a flexible substrate 28 having wiring patterns connected to electrodes of a panel, and others.

In the conventional module (40), the flexible substrate 28 is attached to the metal plate 21, and further a driver IC 25 is mounted. The wirings on the flexible substrate 28 include ground lines 24 connected to the ground of the driver module (40) and signal wirings 23 connected to each address electrode 15, which are disposed on the outermost sides of the flexible substrate 28. Although it depends on the type of the driver IC 25, the number of the signal wirings 23 may be 64, 128, or others. Meanwhile, holes 29 which are used for mounting on mounting parts (3a) of a chassis (3) are formed in the metal plate 21. Further, although one driver IC 25 is mounted on one metal plate 21 in this example, a plurality of driver ICs are mounted in some cases. When three driver ICs with 128 lines are mounted, 384 address electrodes can be driven by one driver module, and when eight driver modules are provided, 3072 address electrodes can be driven. Since one pixel consists of three colors of RGB, the number of pixels in the lateral direction is 1024 in this case. Also in this case, the ground lines 24 are disposed on both outer sides of the flexible substrate 28 in each driver module (40).

FIG. 10 is a partially enlarged view showing the wirings near the boundary between the flexible substrate 28 and the metal plate 21 in the conventional driver module (40) shown in FIG. 9. On the flexible substrate 28, the wirings (23 and 24) to the electrodes of the panel are disposed near the edges in the width direction of the flexible substrate 28.

FIG. 11 is a diagram showing the case where the conventional driver modules 40 are connected to the rear substrate 2. The ground lines 24a and 24b are connected to longitudinal lines on both outer sides of a display area of the PDP, and the signal wirings 23 are connected to the address electrodes. On the other hand, other ground lines 24 are not connected to the electrodes of the rear substrate 2.

SUMMARY OF THE INVENTION

Incidentally, the PDP connected with a flexible substrate generates heat because discharge is generated therein. Also, a driver IC is mounted on a metal plate to which the flexible substrate is provided, and the driver IC also generates heat. However, since the glass of the PDP and the metal plate are different in heat expansion coefficient, stress is applied in a direction of the disposed wirings of the flexible substrate. In particular, the wiring disposed on the outer side in the width direction of the flexible substrate suffers more repetitive stress near the edge portion of the metal plate, and there is the possibility that the metal fatigue occurs.

An object of the present invention is to prevent the metal fatigue of the wirings by means of strengthening the flexible substrate and providing a mounting structure capable of alleviating the stress.

The typical ones of the inventions disclosed in this application will be briefly described as follows. For the achievement of the above-described object, the present invention provides a plasma display module comprising: a plasma display panel; driver modules for driving the plasma display panel; and a chassis which holds the driver modules, wherein the driver module is composed of a flexible substrate electrically connected to the plasma display panel, and a heat radiating member closely adhered to the flexible substrate and fixed to the chassis, and a plurality of electrode wirings which are not connected to the plasma display panel are disposed on outer sides of electrode wirings on the flexible substrate so as to get across an edge surface of the heat radiating member.

The effects obtained by typical aspects of the present invention will be briefly described below. According to the present invention, the structure described above can prevent the metal fatigue of the wirings on the flexible substrate.

BRIEF DESCRIPTIONS OF DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted. FIG. 1 to FIG. 8 are explanatory drawings of the PDP module of the present embodiment.

Figure 1:
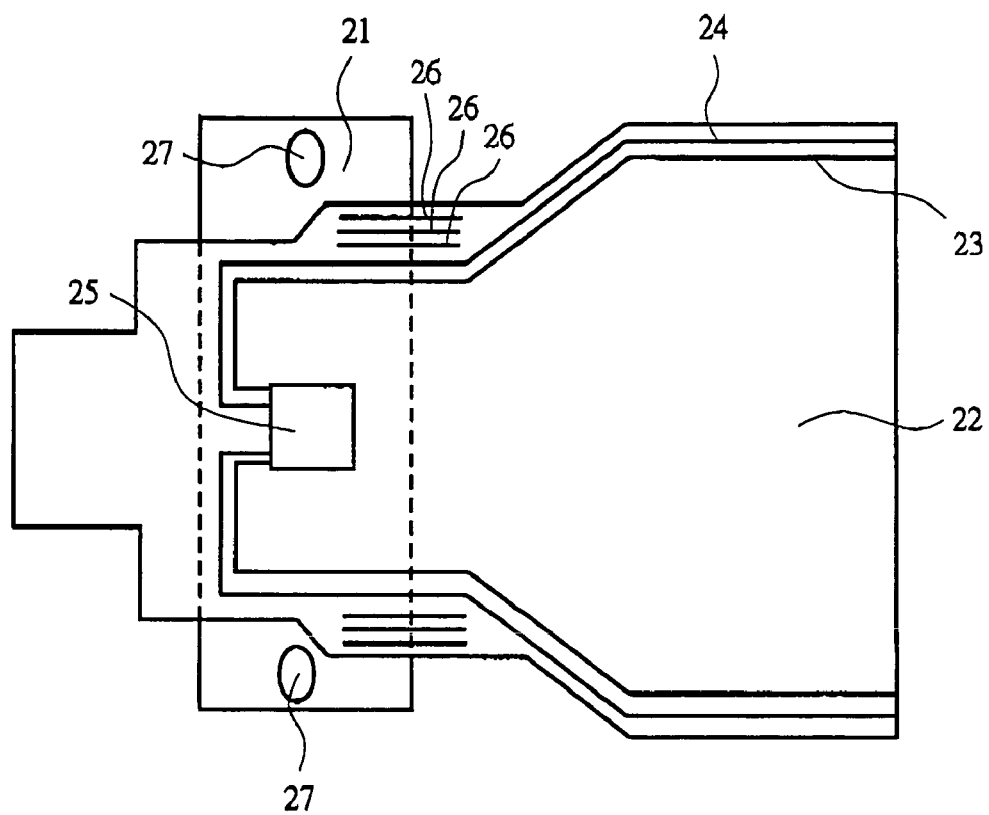
FIG. 1 is a plan view of a driver module according to an embodiment of the present invention.

FIG. 1 shows a structure of a driver module 7 in the PDP module according to the present embodiment. The driver module 7 includes a metal plate 21 serving as a heat radiating member, a flexible substrate 22 having wirings connected to electrodes of a panel, and others. Further, wirings 26 which are not connected to the electrodes of a panel are provided on both edges in a width direction of the flexible substrate 22 and on the outer sides of signal wirings 23 and ground lines 24. The wirings 26 are formed of a plurality of individually separated linear patterns. The metal plate 21 is made of an aluminum material as a heat radiating member.

Figure 2:
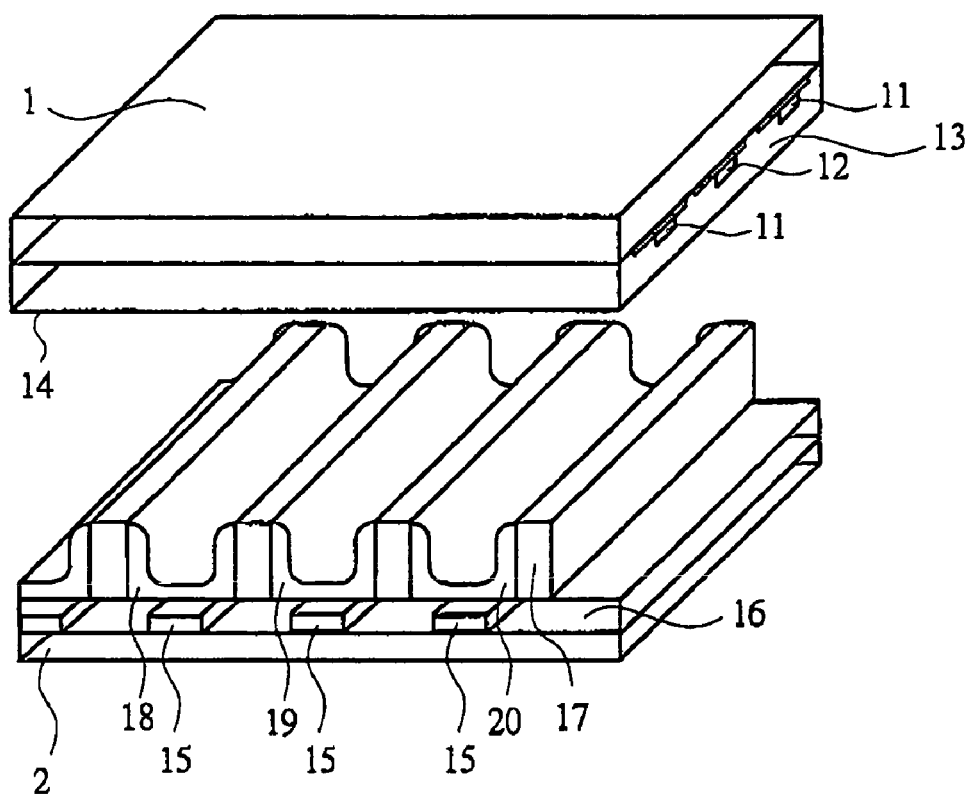
FIG. 2 is an exploded perspective view showing a PDP structure according to the embodiment of the present invention.

FIG. 2 is an exploded perspective view showing an example of a panel structure of a PDP in a PDP module according to the present embodiment. This panel includes a front substrate 1 made of glass, a rear substrate 2 made of glass similar to the front substrate 1, and others.

X electrodes 11 and Y electrodes 12 which perform repetitive discharges are alternately disposed in parallel to each other on the front substrate 1. The group of these electrodes is covered with a dielectric layer 13, and the surface of the dielectric layer 13 is covered with a protective layer made of MgO or the like.

Address electrodes 15 extending in a direction almost perpendicular to the direction of the X electrodes 11 and the Y electrodes 12 are disposed on the rear substrate 2, and the address electrodes 15 are covered with a dielectric layer 16. Barrier ribs 17 are disposed on both sides of the address electrodes 15 to separate the cells in the column direction. Further, phosphors 18, 19, and 20 which are excited by ultraviolet rays to emit visible lights of red (R), green (G) and blue (B) are coated on the dielectric layer 16 on the address electrodes 15 and on the sidewalls of the barrier ribs 17. The front substrate 1 and the rear substrate 2 are bonded so that the protective layer 14 contacts the barrier ribs 17, and discharge gas such as Ne or Xe is filled therein. In this manner, the panel is obtained.

Figure 3:
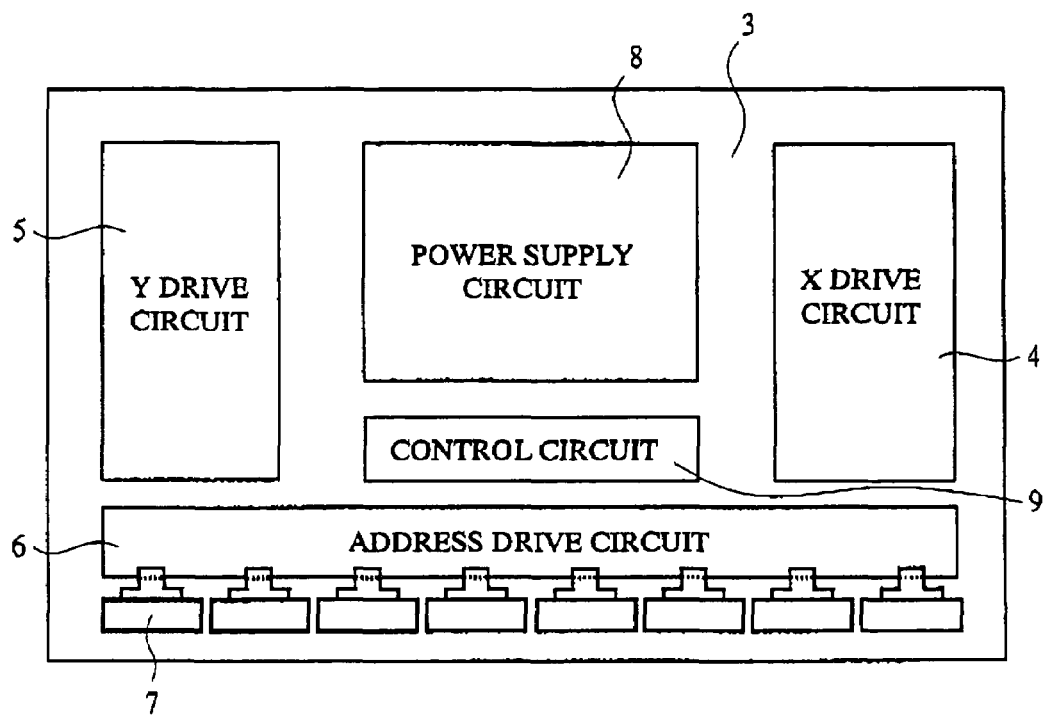
FIG. 3 is a block diagram of a PDP module according to the embodiment of the present invention.

FIG. 3 is a block diagram of the PDP module according to the present embodiment. This module includes a chassis 3, drive circuits (4, 5, 6), a power supply circuit 8, a control circuit 9, driver modules 7, and others.

The chassis 3 provided on the rear face of the rear substrate 2 of the PDP is provided with an X drive circuit 4 which applies voltage to X electrodes 11, a Y drive circuit 5 which applies voltage to Y electrodes 12, an address drive circuit 6 which applies voltage to address electrodes 15, driver modules 7 (8 modules in this example) mounted with an address driver, a power supply circuit 8 for each drive circuit, and a control circuit 9 which controls the circuits described above. Although the address drive circuit 6 and the driver modules 7 are disposed in a lower portion of the PDP module in this example, they may be disposed in lower and upper portions thereof in some cases.

Figure 4:
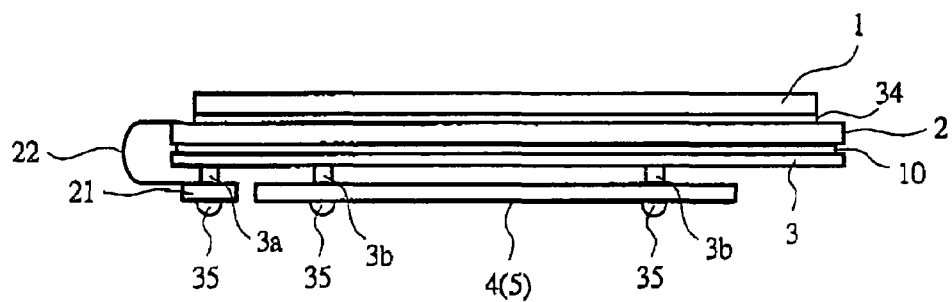
FIG. 4 is a side view of the PDP module according to the embodiment of the present invention.

FIG. 4 is a diagram showing the PDP module according to the present embodiment seen from a lateral side. A seal 34 for sealing the discharge gas is provided between the front substrate 1 and the rear substrate 2. Also, the rear substrate 2 is attached to the chassis 3 with adhesive 10. The chassis 3 is provided with mounting parts 3a and 3b, and the X drive circuit 4, the Y drive circuit 5, the address drive circuit 6, the metal plate 21 of the driver module 7, the power supply circuit 8, and the control circuit 9 are attached thereto with screws 35. In addition, the flexible substrate 22 of the driver module 7 is connected to the electrodes of the rear substrate 2. Note that, though not shown, the X drive circuit 4 and the Y drive circuit 5 are also connected to the front substrate 1 through the flexible substrate.

Subsequently, the driver module 7 in the PDP module according to the present embodiment will be described with reference to FIG. 1. In this driver module 7, the flexible substrate 22, which is different from the conventional one and is a characteristic part of the present invention, is attached to the metal plate 21 and the driver IC 25 is further provided thereon in the same manner as the conventional driver module 40. The wirings on the flexible substrate 22 include ground lines 24 connected to the ground of the driver module 7 and signal wirings 23 connected to each address electrode 15, which are disposed on the outermost sides in the width direction of the flexible substrate 22. Furthermore, a plurality of wirings 26 which are not connected to the electrodes of the rear substrate 2 are provided near the boundary between the flexible substrate 22 and the metal plate 21.

The wirings 26 are laid in a direction almost perpendicular to the edge surface of the metal plate 21, protrude from the edge surface by about 5 mm, and covers the bend section where metal fatigue may occur so as to achieve the effect of preventing the metal fatigue. The width of the area where the wirings 26 are provided is at least 5 mm or more on one side, and it corresponds to about 5 or more of the width of the flexible substrate 22. Note that the width of a part of the flexible substrate 22 where the wirings 26 are disposed is narrower than the width of a part connected to the rear substrate 2. Accordingly, it is possible to reduce the size of the driver module 7 while preventing the metal fatigue of the wirings for driving the panel electrodes, and as a result, it is possible to achieve the cost reduction and the resolution improvement.

On the other hand, holes 27, which are used for mounting on mounting parts 3a of the chassis 3 and formed in the metal plate 21 of the present embodiment, have an ellipse shape elongated in a width direction of the flexible substrate 22. Since the holes 27 with such a shape are formed, when the metal plate 21 is fixed to the chassis 3, there are spaces in the width direction of the flexible substrate 22. Therefore, when the driver module 7 is mounted on the chassis 3, the driver module 7 can be smoothly mounted without stresses to the flexible substrate 22 due to the misalignment resulting from the variation in design dimensions of the chassis 3 and the driver module 7. Accordingly, it is possible to achieve the effect of alleviating the metal fatigue of the wirings of the flexible substrate 22.

Figure 5:
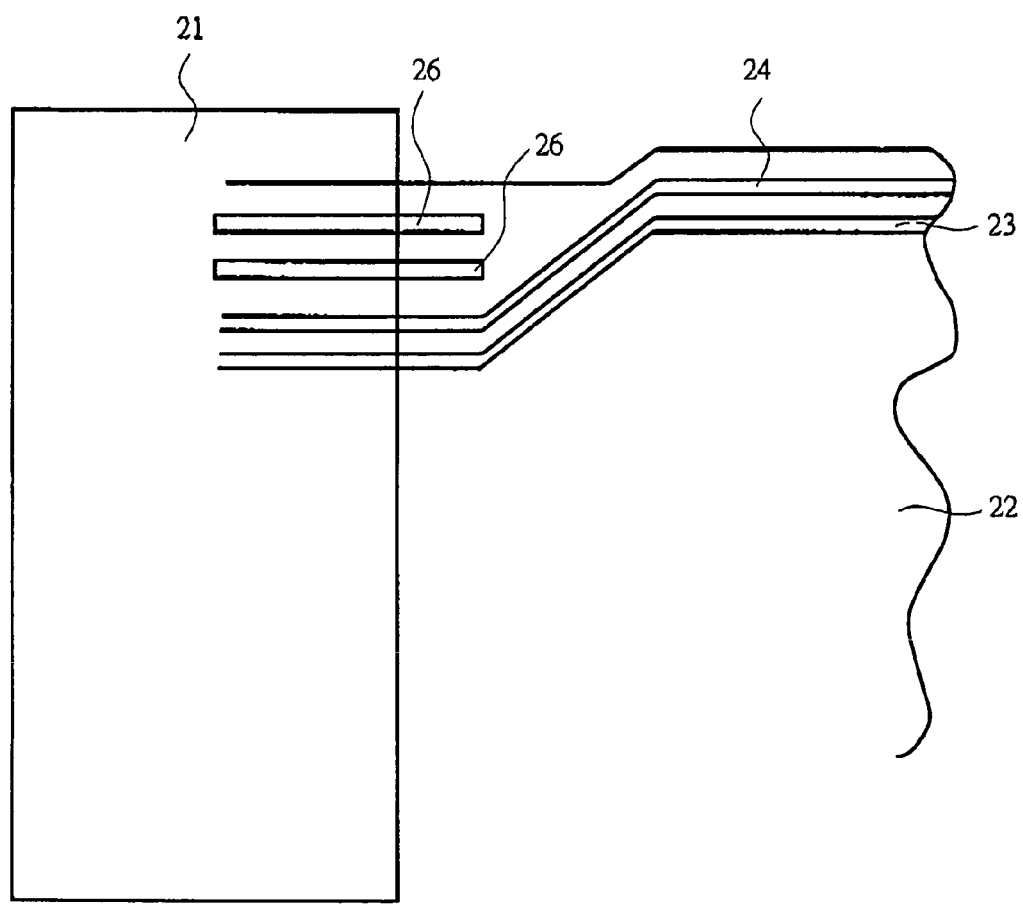
FIG. 5 is a partially enlarged view showing the driver module according to the present invention.

FIG. 5 is a partially enlarged view showing the wirings near the boundary between the flexible substrate 22 and the metal plate 21 in the driver module 7 according to the present embodiment shown in FIG. 1. In this case, the space between the wiring 26 and the ground line 24 is wider than the space between the signal wirings 23 and that between the signal wiring 23 and the ground line 24. By doing so, it is possible to keep the signal wirings 23 as far away as possible from the wirings 26 for preventing and alleviating the metal fatigue, and therefore, the prevention effect can be further enhanced. Also, the space between the wirings 26 is wider than the space between the signal wirings 23 and that between the signal wiring 23 and the ground line 24. By doing so, it is possible to keep the signal wiring 23 more away from the wirings 26 for preventing and alleviating the metal fatigue. Furthermore, the space between the wiring 26 and the ground line 24 is wider than the space between the wirings 26. By doing so, the similar effect as described above can be achieved. In addition, the width of the plurality of wirings 26 is wider than the width of the plurality of signal wirings 23. By doing so, the similar effect as described above can be achieved.

Also, in the driver module 7, the wiring pattern width of the part on the outer side of the ground line 24 or the signal wiring 23 is wider than the wiring pattern width of the part on the inner side of the signal wiring 23. By doing so, in the signal wirings 23 on the flexible substrate 22 connected to the panel, the metal fatigue in the outer side wiring where the metal fatigue is apt to occur can be further prevented. Accordingly, the further preventing and alleviating effect can be obtained.

Figure 6:
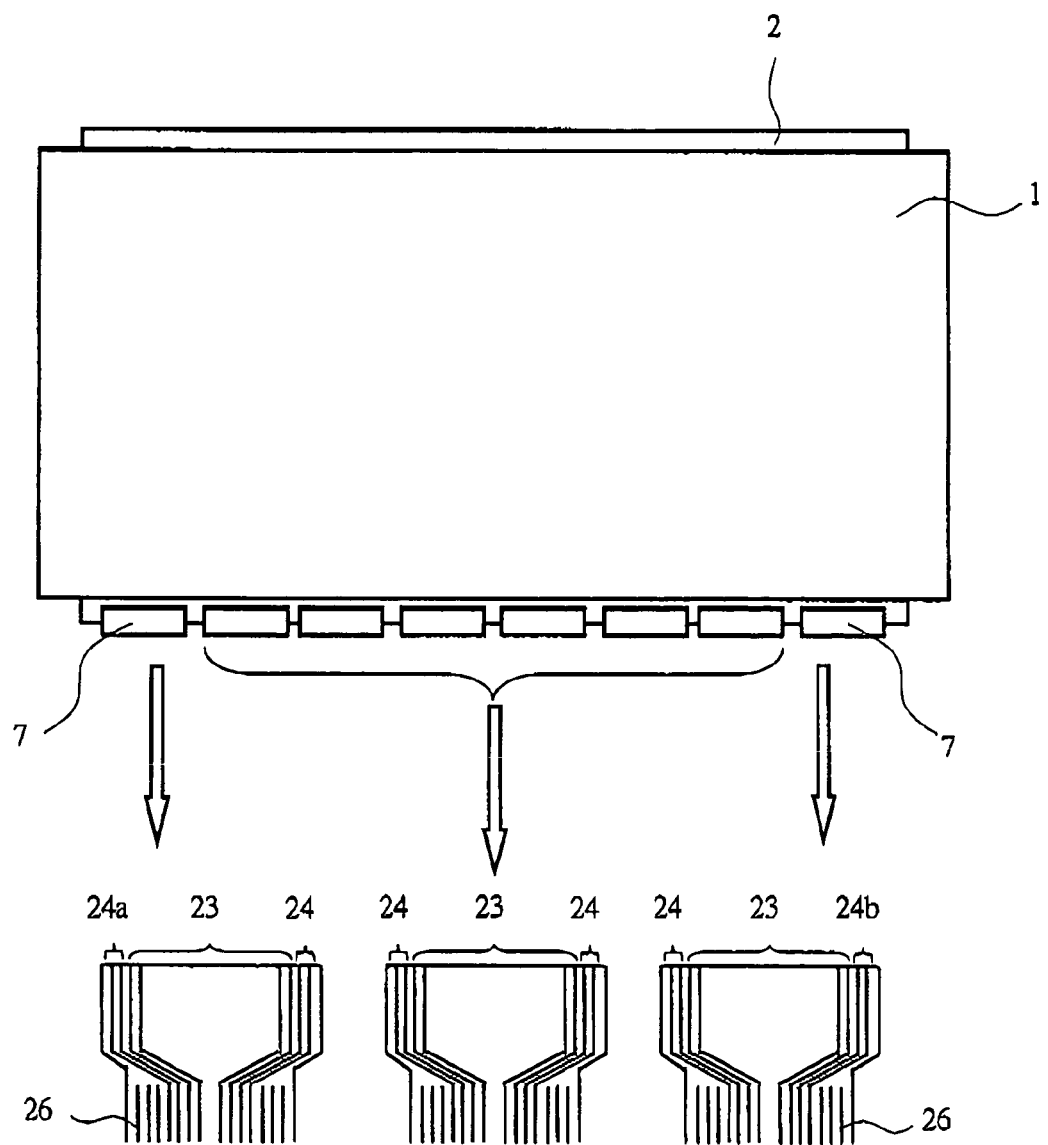
FIG. 6 is a diagram showing the case where the driver modules are connected to a rear substrate according to the embodiment of the present invention.

FIG. 6 is a diagram showing the case where the driver modules 7 according to the present embodiment are connected to the rear substrate 2. The ground lines 24a and 24b are connected to longitudinal lines on both outer sides of a display area of the PDP, and the signal wirings 23 are connected to the address electrodes. On the other hand, other ground lines 24 are not connected to the electrodes of the rear substrate 2.

Figure 7:
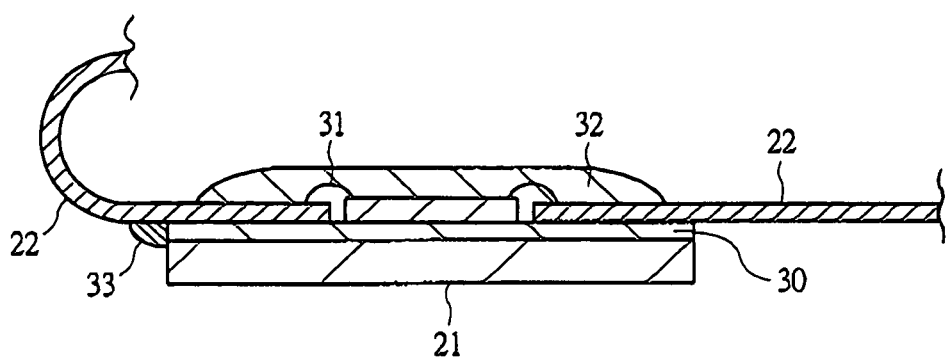
FIG. 7 is a cross-sectional view of the driver module according to the embodiment of the present invention.

FIG. 7 is a cross-sectional view of the driver module 7 according to the present embodiment. The flexible substrate 22 is attached to a surface of the metal plate 21 with adhesive 30, and the driver IC 25 is wired by wires 31 and is covered with resin 32. Also, silicon 33 is applied to the boundary portion between the flexible substrate 22 and the metal plate 21 so as to fix the lower surface of the flexible substrate 22 to the outer edge surface of the metal plate 21.

Figure 8:
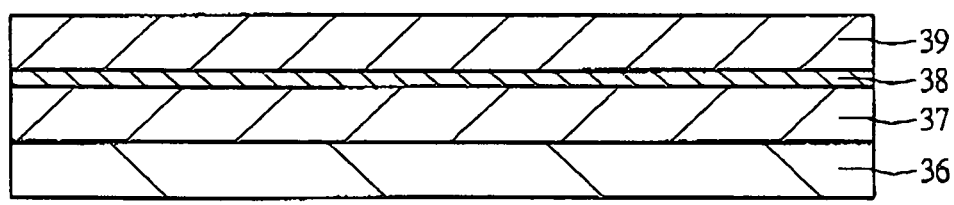
FIG. 8 is a cross-sectional view of the flexible substrate according to the embodiment of the present invention.
Figure 9:
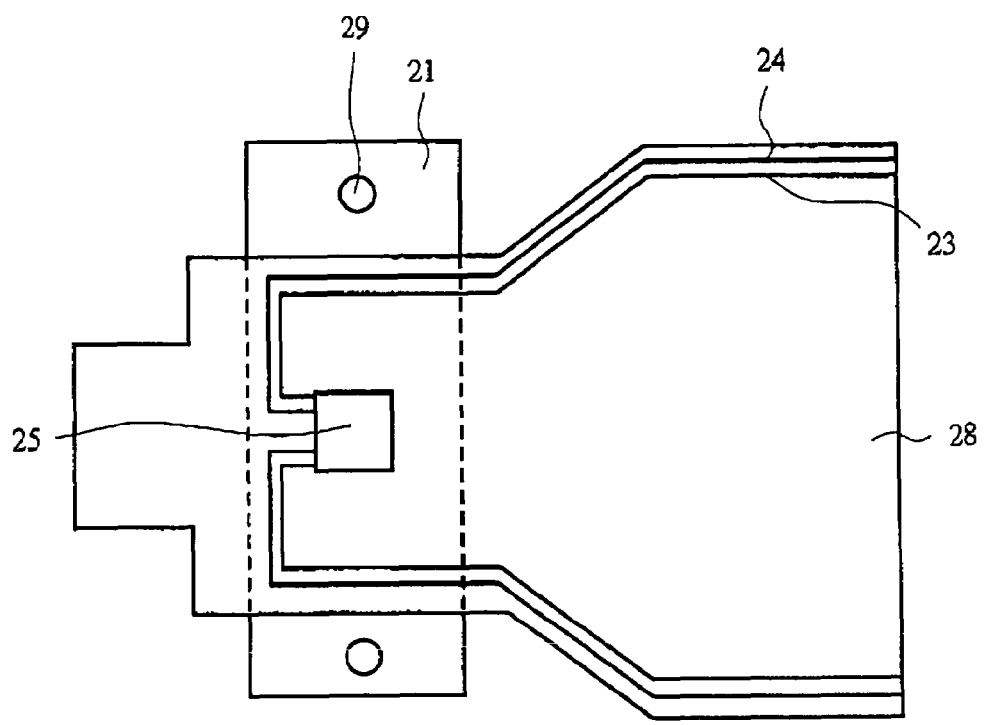
FIG. 9 is a plan view of a conventional driver module.
Figure 10:
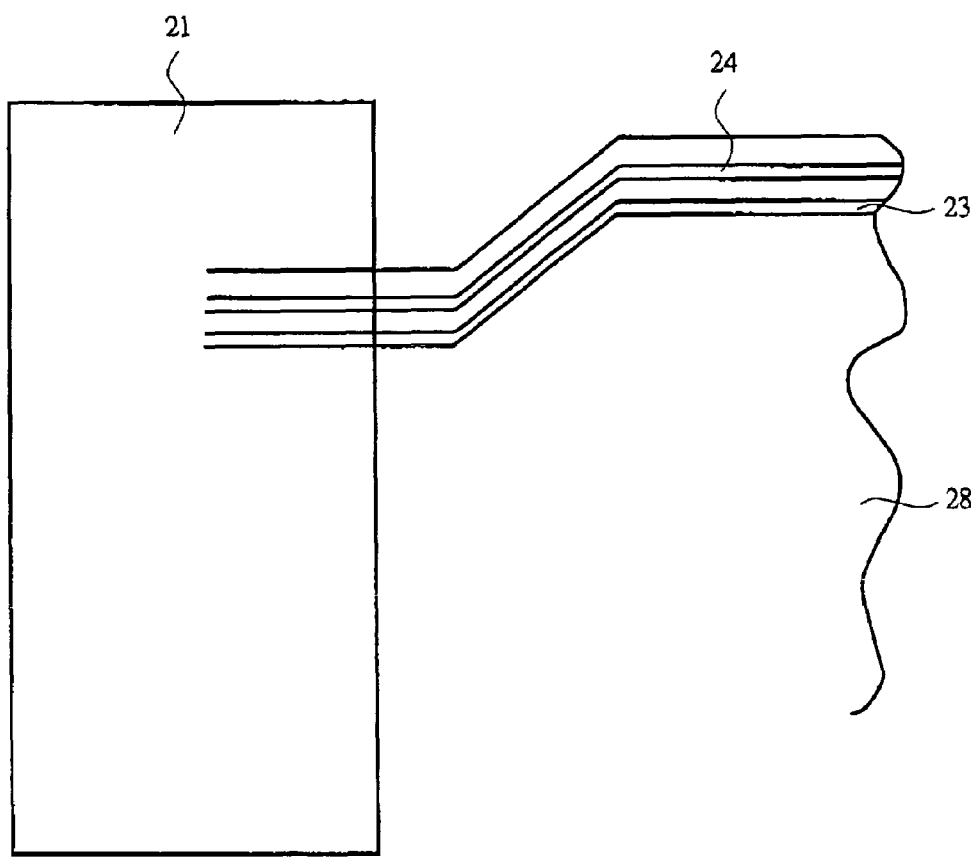
FIG. 10 is a partially enlarged view of the conventional driver module.
Figure 11:
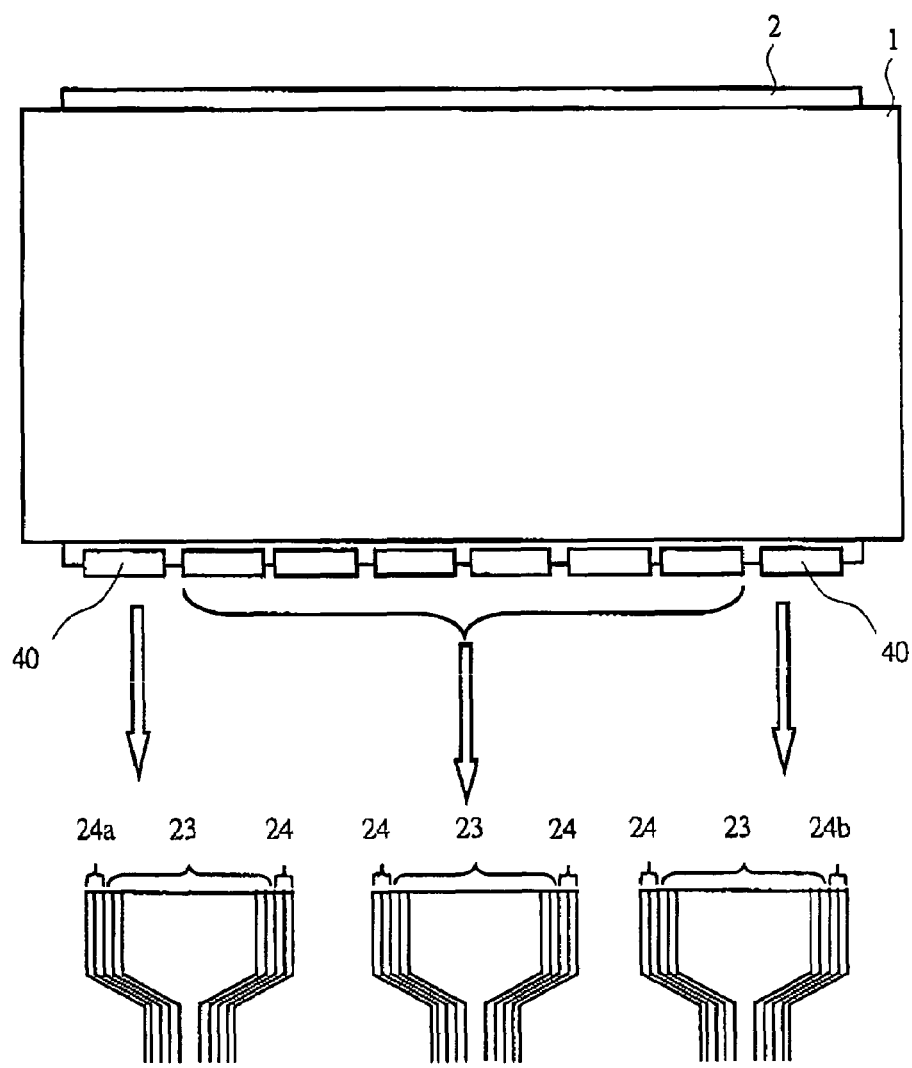
FIG. 11 is a diagram showing the case where the conventional driver modules are connected to a rear substrate.

FIG. 8 is a cross-sectional view of the flexible substrate 22 according to the present embodiment. In the cross section of the flexible substrate 22, the wirings are formed of a copper foil 37 on a base film 36. The structure is called a copper-clad lamination in general. A cover film 39 is adhered further thereon with an adhesive layer 38. Note that the glass transition temperature of the adhesive layer 38 as an adhesive for the cover layers which form the flexible substrate 22 is 40° C. or higher.

Next, an operation of the PDP module according to the present embodiment will be described. In the module shown in FIG. 3, the driver modules 7 are fixed to the metal chassis 3. Also, as shown in FIG. 6, the flexible substrate 22 is connected to the rear substrate 2 made of glass. Since the PDP generates heat due to the discharges therein, the driver modules 7 disposed on both sides of the PDP suffer the repetitive stress in the width direction particularly in the edge portion of the flexible substrate 22 near the boundary with the metal plate 21 due to the difference in thermal expansion coefficient of the chassis 3, the metal plate 21, and the rear substrate 2. Accordingly, there is the possibility that the metal fatigue occurs in the outer wirings. For its prevention, a plurality of wirings 26 are provided on both sides in the width direction of the flexible substrate 22 in the present embodiment as shown in FIG. 1. Therefore, it is possible to alleviate the metal fatigue of the ground lines 24 and the signal wirings 23.

Also, since holes 27 formed in the metal plate 21 have an ellipse shape elongated in a width direction of the flexible substrate 22, the stress due to the difference in thermal expansion can be alleviated. Furthermore, the stress is alleviated also by fixing the metal plate 21 to the flexible substrate 22 with the silicon 33 as shown in FIG. 7. In addition, since the glass transition temperature of the adhesive layer 38 shown in FIG. 8 is set to 40° C. or higher, the deterioration of the flexible substrate 22 itself due to heat can be prevented.

According to the present embodiment, the present invention is useful to prevent the breakage of a large-size flat display such as PDP, in which a flexible substrate is used and heat is generated.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be applied to a large-size flat display such as PDP, in which a flexible substrate is used and heat is generated.

What is claimed is:

1. A plasma display module comprising:
   a plasma display panel;
   driver modules for driving said plasma display panel; and
   a chassis which holds said driver modules,
   wherein:
   said driver module is composed of a flexible substrate electrically connected to said plasma display panel, and a heat radiating member closely adhered to said flexible substrate and fixed to said chassis,
   a plurality of individually separated linear patterns are disposed on an outer side of wiring patterns for driving electrodes on said flexible substrate so as to get across an edge surface of said heat radiating member, and
   said linear patterns are not electrically connected to said driver module.

2. The plasma display module according to claim 1, wherein said plurality of linear patterns are disposed on both edge portions in a width direction of said flexible substrate which gets across the edge surface of said heat radiating member.

3. The plasma display module according to claim 1, wherein said linear patterns are disposed so as to approximately vertically get across the edge surface of said heat radiating member.

4. The plasma display module according to claim 2, wherein a width of a part of said flexible substrate on which said liner patterns are disposed is narrower than a width of a part of said flexible substrate connected to said plasma display panel.

5. The plasma display module according to claim 3, wherein said linear patterns are disposed so as to protrude from the edge surface of said heat radiating member by 5 mm or more.

6. The plasma display module according to claim 4, wherein a space between said linear pattern and said wiring pattern for driving the electrodes is wider than a space between the plurality of wiring patterns for driving the electrodes connected to the electrodes of said plasma display panel.

7. The plasma display module according to claim 5, wherein an aluminum material is used as said heat radiating member.

8. The plasma display module according to claim 6,
wherein a space between said linear patterns is wider than a space between the plurality of wiring patterns for driving the electrodes connected to the electrodes of said plasma display panel.

9. The plasma display module according to claim 7,
wherein said heat radiating member has holes elongated in the width direction of said flexible substrate and formed at positions corresponding to mounting parts to fix the heat radiating member and said chassis.

10. The plasma display module according to claim 8,
wherein a space between said linear pattern and said wiring pattern for driving the electrodes is wider than a space between said linear patterns.

11. The plasma display module according to claim 9,
wherein said flexible substrate is formed to have a two-layered copper-clad lamination having no adhesive layer between a copper foil and a base film member.

12. The plasma display module according to claim 10,
wherein a width of said linear patterns is wider than a width of the wiring patterns for driving the electrodes connected to the electrodes of said plasma display panel.

13. The plasma display module according to claim 11,
wherein a material with a glass transition temperature of 40° C. or higher is used as an adhesive for cover layers which form said flexible substrate.

14. The plasma display module according to claim 13,
wherein a silicon member is coated on a edge surface of said heat radiating member which is closely adhered to said flexible substrate.

15. The plasma display module according to claim 14,
wherein a width of a wiring pattern disposed on an outer periphery of the plurality of wiring patterns for driving the electrodes connected to the electrodes of said plasma display panel is wider than a width of a wiring pattern disposed on an inner periphery thereof.

16. A plasma display module comprising:
a plasma display panel;
driver modules for driving said plasma display panel; and
a chassis which holds said driver modules,
wherein:
said driver module has a flexible substrate electrically connected to electrodes of said plasma display panel, and a metal plate which holds said flexible substrate, a plurality of patterns are separated from wiring patterns for driving the electrodes on said flexible substrate, located on outer area of said flexible substrate and not electrically connected to the electrodes of said plasma display panel, and
a portion of said plurality of patterns separated from the wiring patterns is located on the metal plate and the other portion of said plurality of patterns is located outside of the metal plate.

17. The plasma display module according to claim 16,
wherein said plurality of patterns separated from the wiring patterns are disposed on both edge portions in a width direction of said flexible substrate which gets across the edge surface of said metal plate.

18. The plasma display module according to claim 16,
wherein a space between said plurality of patterns separated from the wiring patterns is wider than a space between the wiring patterns for driving the electrodes connected to the electrodes of said plasma display panel.

19. A plasma display module comprising:
a plasma display panel;
driver modules for driving said plasma display panel; and
a chassis which holds said driver modules,
wherein said driver module has a flexible substrate whose signal wirings are electrically connected to electrodes of said plasma display panel, and a driver IC which is electrically connected to the signal wirings and a metal plate which holds a portion of said flexible substrate with adhesive, and
wherein a plurality of patterns are located outside of the signal wirings on said flexible substrate and not electrically connected to the driver IC.

20. The plasma display module according to claim 19,
wherein said plurality of patterns located outside of the signal wirings are disposed on both edge portions in a width direction of said flexible substrate which gets across the edge surface of said metal plate.

21. The plasma display module according to claim 19,
wherein a space between said plurality of patterns located outside of the signal wirings is wider than a space between the plurality of signal wirings for driving the electrodes connected to the electrodes of said plasma display panel.

* * * * *